US010857655B2

(12) United States Patent
Cuvalci et al.

(10) Patent No.: US 10,857,655 B2
(45) Date of Patent: Dec. 8, 2020

(54) SUBSTRATE SUPPORT PLATE WITH IMPROVED LIFT PIN SEALING

(71) Applicant: APPLIED MATERIALS, INC., Santa Clara, CA (US)

(72) Inventors: Olkan Cuvalci, Sunnyvale, CA (US); Gwo-Chuan Tzu, Sunnyvale, CA (US); Xiaoxiong Yuan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 676 days.

(21) Appl. No.: 13/798,424

(22) Filed: Mar. 13, 2013

(65) Prior Publication Data

US 2014/0265097 A1    Sep. 18, 2014

(51) Int. Cl.
*B25B 11/00* (2006.01)
*H01L 21/687* (2006.01)

(52) U.S. Cl.
CPC ........ *B25B 11/00* (2013.01); *H01L 21/68742* (2013.01)

(58) Field of Classification Search
CPC .... H05K 13/0069; B23Q 1/035; B25B 11/00; B25B 1/2421; F16B 21/02; F16B 21/04; H01J 37/32715; H01J 37/32623; H01J 37/32724; C23C 16/4586; H01L 21/6833
USPC ......... 269/53, 54, 54.4, 54.5, 265, 266, 267, 269/254 CS, 32, 201, 223, 309, 310
See application file for complete search history.

(56) References Cited

U.S. PATENT DOCUMENTS

| 3,449,004 | A | * | 6/1969 | Anderson | .................. 403/408.1 |
| 3,564,563 | A | * | 2/1971 | Trotter et al. | ................. 411/552 |
| 4,128,923 | A | * | 12/1978 | Bisbing | ......................... 411/552 |
| 4,684,113 | A | * | 8/1987 | Douglas et al. | ................. 269/21 |
| 4,756,638 | A | * | 7/1988 | Neyret | .......................... 403/261 |
| 4,790,258 | A | * | 12/1988 | Drage | .............. H01L 21/68742 118/500 |
| 5,597,260 | A | * | 1/1997 | Peterson | ................. F16B 21/04 403/316 |
| 5,788,903 | A | * | 8/1998 | Allgaier | ................ B29C 33/303 264/219 |
| 5,848,670 | A | * | 12/1998 | Salzman | ................... B66F 7/00 118/728 |
| 5,879,128 | A | * | 3/1999 | Tietz | ................. H01L 21/68742 414/757 |
| 5,946,184 | A | * | 8/1999 | Kanno et al. | .................. 361/234 |
| 5,961,388 | A | * | 10/1999 | Breidenbach et al. | ........ 464/133 |
| 5,984,293 | A | * | 11/1999 | Abrahamson et al. | ........ 269/266 |
| 6,022,207 | A | * | 2/2000 | Dahlin et al. | ................. 425/145 |
| 6,118,100 | A | * | 9/2000 | Mailho | ............... C23C 16/4584 118/728 |

(Continued)

FOREIGN PATENT DOCUMENTS

DE        1908002 A1 *  2/1970  ............ F16B 5/0208

*Primary Examiner* — Lee D Wilson
*Assistant Examiner* — Joel D Crandall
(74) *Attorney, Agent, or Firm* — Moser Taboada

(57) ABSTRACT

Embodiments of lift pin assemblies and substrate supports having such lift pin assemblies are provided herein. In some embodiments, a lift pin assembly includes a body with a first end including a flange and an opposing second end; a bore through the body from the first end to the second end; a profile on an outer surface proximate a second end; and a collar, wherein the profile is configured to removably lock the collar onto the second end.

19 Claims, 7 Drawing Sheets

(56) References Cited

U.S. PATENT DOCUMENTS

| | | | |
|---|---|---|---|
| 6,126,356 A * | 10/2000 | Russell | G03G 15/0935 403/24 |
| 6,148,762 A * | 11/2000 | Fukuda | C23C 16/4581 118/715 |
| 6,261,042 B1 * | 7/2001 | Pratt | 411/551 |
| 6,389,677 B1 * | 5/2002 | Lenz | 29/559 |
| 6,730,175 B2 * | 5/2004 | Yudovsky | C23C 16/45521 118/500 |
| 6,887,317 B2 * | 5/2005 | Or | C23C 16/4401 118/500 |
| 7,036,810 B2 * | 5/2006 | Wal, III | B23Q 3/183 269/289 R |
| 8,033,245 B2 * | 10/2011 | Kurita | B65G 49/061 118/723 E |
| 2002/0011204 A1 * | 1/2002 | Gujer | C23C 16/405 118/500 |
| 2004/0047711 A1 * | 3/2004 | Cuva et al. | 411/383 |
| 2005/0000450 A1 * | 1/2005 | Iizuka | H01L 21/68742 118/728 |
| 2006/0156981 A1 * | 7/2006 | Fondurulia | C23C 16/4408 118/715 |
| 2009/0074539 A1 * | 3/2009 | Mandavi | 411/533 |
| 2009/0314211 A1 * | 12/2009 | Du Bois et al. | 118/729 |
| 2011/0033620 A1 * | 2/2011 | Polyak | C23C 16/4586 427/248.1 |
| 2011/0164955 A1 * | 7/2011 | White | H01L 21/68742 414/800 |
| 2012/0073754 A1 * | 3/2012 | de la Llera et al. | 156/345.34 |

\* cited by examiner

SUBSTRATE SUPPORT PLATE WITH IMPROVED LIFT PIN SEALING

FIELD

Embodiments of the present invention generally relate to semiconductor processing equipment.

BACKGROUND

Common methods of semiconductor fabrication produce patterns of material on a surface of a wafer or substrate, for example by depositing material on a substrate surface or by removing portions of the material. During processing, the substrate rests on a support plate of a substrate support.

During loading and unloading of the substrate onto the support plate, the substrate is typically supported on lift pins that are vertically displaceable with respect to the horizontal support plate. The lift pins extend to a position above the height of the raised rim to accept the substrate. Prior to processing, the lift pins retract, placing the substrate on the substrate support. Often the pins continue to retract into a fully retracted position in which they are seated on or in the support plate. After processing, the lift pins extend to lift the substrate off the substrate support for removal of the substrate.

Lift pins are often formed from a material different than the support plate material and have different coefficients of thermal expansion. Clearance must be provided between the lift pin and bearing portions of the support plate to facilitate vertical displacement of the lift pins. Often significant clearances are necessary to account for the different thermal expansions between the lift pins and the support plate in order to allow unhindered displacement of the lift pins under all temperature conditions.

Often a pressure differential exists between a first region between the backside of the substrate and the support plate and a second region outside of the first region (for example, a processing volume within the process chamber). However, the inventors have observed that because of the clearance provided in the support plate for the lift pins, it may be difficult to control or maintain the desired pressure differential.

Therefore, the inventors have provided improved lift pin assemblies and substrate supports incorporating such lift pin assemblies.

SUMMARY

Embodiments of lift pin assemblies and substrate supports having such lift pin assemblies are provided herein. In some embodiments, a lift pin assembly includes a body with a first end including a flange and an opposing second end; a bore through the body from the first end to the second end; a profile on an outer surface proximate a second end; and a collar, wherein the profile is configured to removably lock the collar onto the second end.

In some embodiments, a substrate support includes a plate having a top surface and an opposing bottom surface; a hole formed through the plate, the hole including a counterbore or countersink at the top surface and a second counterbore disposed in the second surface of the plate about the hole; a body with a first end including a flange configured to interface with the counterbore or countersink, an opposing second end, and a bore through the body, wherein the body is disposed within the hole such that the flange is disposed at least partially in the counterbore or countersink; a collar removably coupled to the second end of the body; and a resilient element disposed within the hole and compressed between the plate and the collar, wherein the resilient element biases the body against the plate.

In some embodiments, a substrate support includes a plate having a top surface and an opposing bottom surface; a lift pin hole formed through the plate, the lift pin hole comprising a first portion at the top surface, the first portion comprising a base, a second portion proximate to the bottom surface comprising a shoulder; and a third portion, linking the first and second portions and sized to accept the body, wherein the first portion is radially larger than the third portion, and the second portion is radially larger than the third portion; a collar comprising an outer wall sized for axial displacement within the second portion, an inner wall forming the boundary of an aperture sized to accept the body and configured to engage the profile at a point along a length of the body to block axial displacement of the collar along the body; and an upper surface between the outer wall and the inner wall; and a resilient element having an outside dimension sized for axial displacement within the second portion, and an inner dimension greater than the third portion; wherein the bushing is arranged within the lift pin hole such that the flange is at least partially within the first portion and the second end extends at least partially through the second portion, wherein the resilient element is arranged coaxially with the second portion and at least partially within the second portion, and wherein the collar is advanced along the body such that the body is received within the aperture and the upper surface at least partially compresses the resilient element against the shoulder and the inner wall engages the profile and blocks axial movement along the body.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
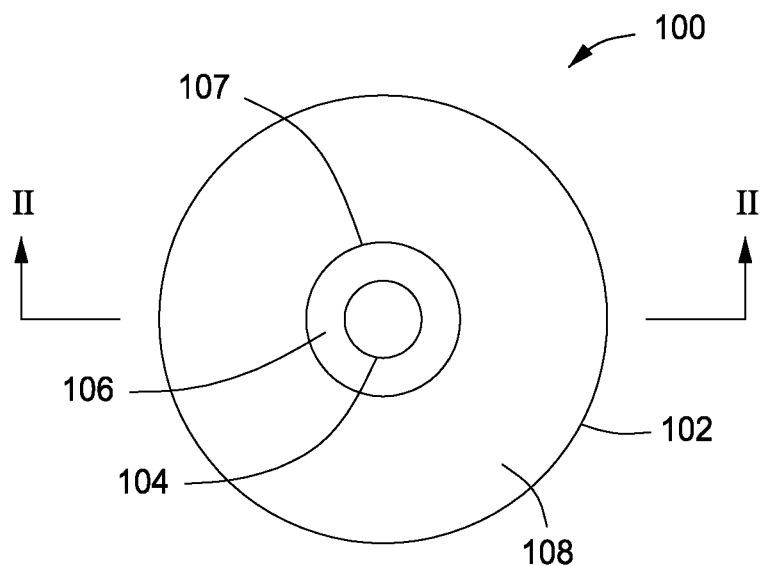
FIG. 1 depicts a top view of a lift pin bushing in accordance with at least some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to improved lift pin assemblies and substrate supports comprising the lift pin assembly to provide support to a substrate during processing. The inventive lift pin assemblies and substrate supports advantageously provide enhanced sealing between the lift pin assemblies and a support plate of the substrate support. The improved sealing characteristics of the inventive lift pin assemblies and substrate supports may contribute beneficially to the formation and maintenance of a backside pressure differential during processing, as discussed in more detail below.

FIG. 1 depicts a top view of a lift pin bushing or bushing 100 in accordance with embodiments of the present invention. The bushing 100 comprises flange 102, bore 104, a radially expanding portion 106, and top surface 108.

Figure 2:
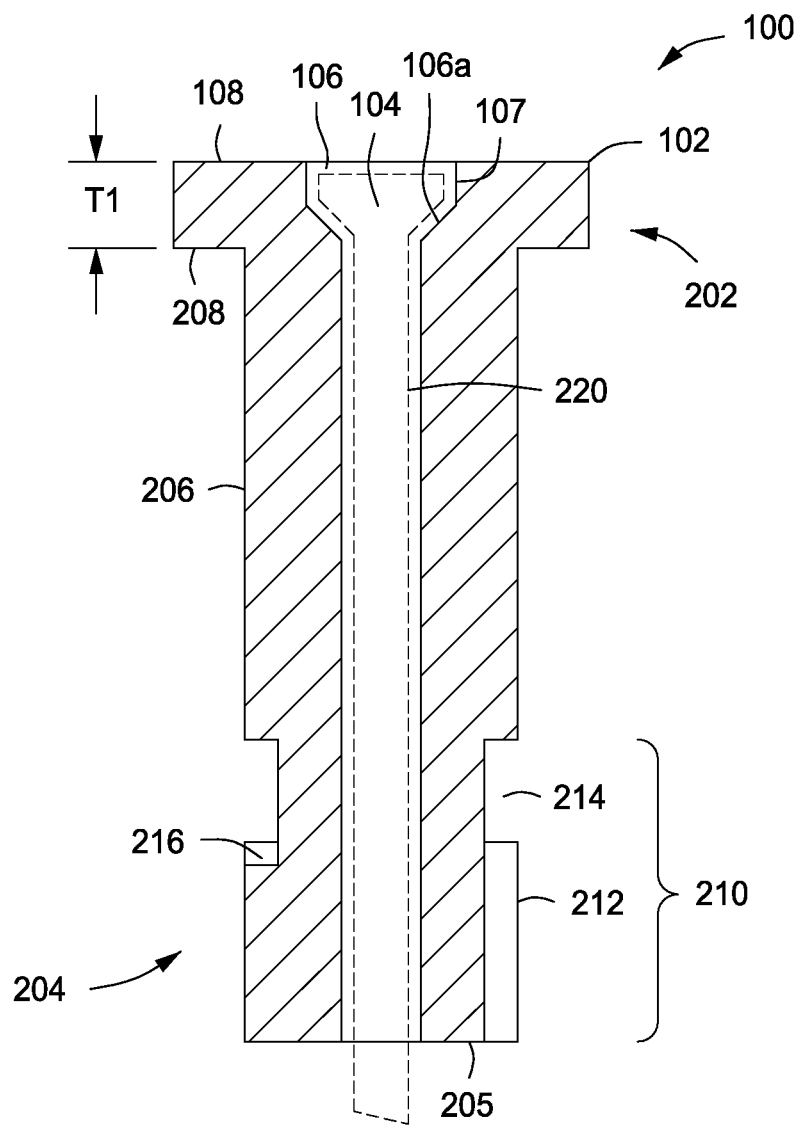
FIG. 2 depicts a cross sectional view of the lift pin bushing of FIG. 1 taken along line II-II.

In the non-limiting embodiment illustrated in FIG. 2, bushing 100 comprises a first end 202, an opposing second end 204, and a generally cylindrical body 206. The flange 102 extends radially from the body 206 at the first end 202 and has a thickness T1 bounded by the top surface 108 and an opposite bottom surface 208 of the flange 102. In the non-limiting embodiment illustrated in FIG. 2, the bottom surface 208 is generally parallel to the top surface 108. In other embodiments, the bottom surface 208 may inclined at an angle with respect to the top surface 108. The flange 102 is illustrated as cylindrical, although it may have any convenient shape, for example, rectangular or other polygonal shape.

The bushing 100 comprises a generally cylindrical bore 104 through the length of the bushing 100. At the first end 202 of the exemplary bushing 100, the bore 104 includes a radially expanding portion 106. The radially expanding portion 106 may comprise a sealing surface 106a to sealingly interface with a lift pin (e.g., lift pin 220 shown in phantom), as discussed below. The radially expanding portion 106 may terminate at a cylindrical portion 107 proximate flange top surface 108 as illustrated. In other embodiments, the bore 104 radially expands all the way to the top surface 108.

Figure 3:
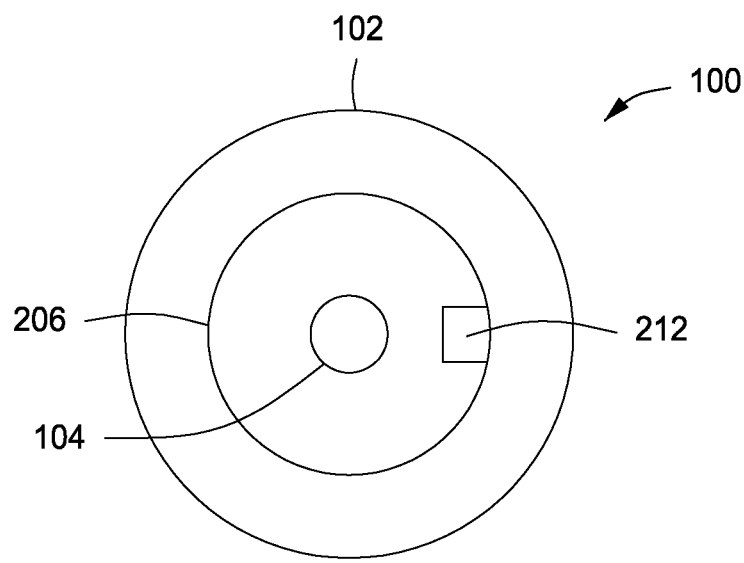
FIG. 3 depicts a bottom view of a lift pin bushing in accordance with at least some embodiments of the present invention.

Second end 204 comprises a profile, generally illustrated as 210, configured to releasably or removably lock a collar (not shown in FIG. 2) to the bushing, for example to limit or prevent at least axial displacement of the bushing 100 when installed in a support plate of a substrate support. Exemplary embodiments of a locking collar and bushing are discussed below. In a non-limiting embodiment illustrated in FIGS. 2 and 3, profile 210 includes an axial groove or axial slot 212 extending from the second end surface 205 and intersecting a circumferential slot 214. Only one axial slot 212 is shown. In some embodiments, a plurality of axial slots 212, spaced around the circumference of the second 204, may extend from the second end surface 205 to the circumferential slot 214 (e.g., two, three, or four). The circumferential slot 214 may fully encircle the second end 204 or may partially extend around the second end 204. In some embodiments, the circumferential slot 214 may include a detent 216. The detent may be a localized depression in a portion of the circumferential slot 214. In some embodiments, the detent 216 is a localized depression in a portion of the circumferential slot 214 on a side opposite the axial slot 212. In some embodiments, the detent 216 is a localized depression in a portion of the circumferential slot 214 on a side opposite the axial slot 212 and on a side of the circumferential slot 214 adjacent the second end 204 of the bushing 100.

The bushing 100 may be formed from any process compatible material including non-limiting example such as aluminum nitride, aluminum oxide, or other ceramic materials, coated or uncoated metals, such as stainless steel, aluminum, nickel, or nickel-based alloys, such as Hastelloy®.

Figure 4:
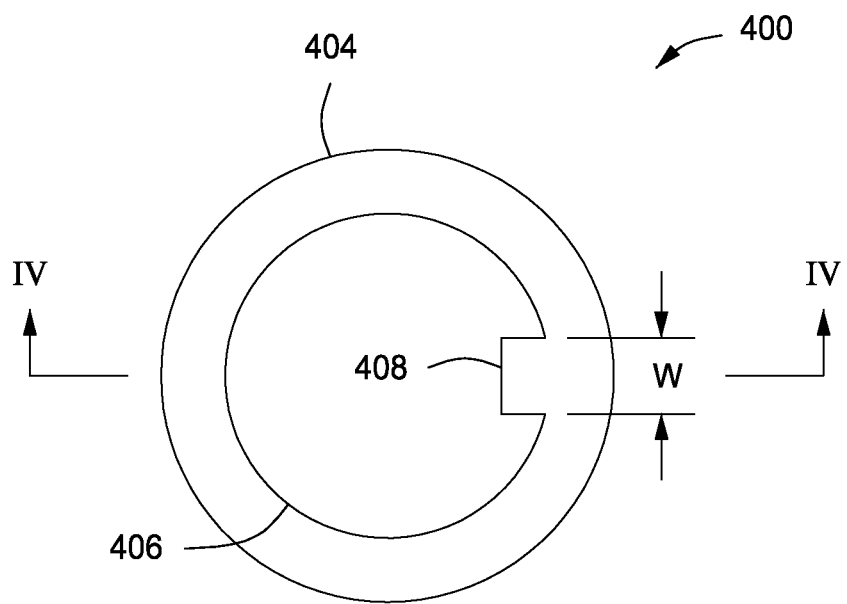
FIG. 4 depicts a top view of a collar for use in a lift pin assembly in accordance with at least some embodiments of the present invention.
Figure 4A:
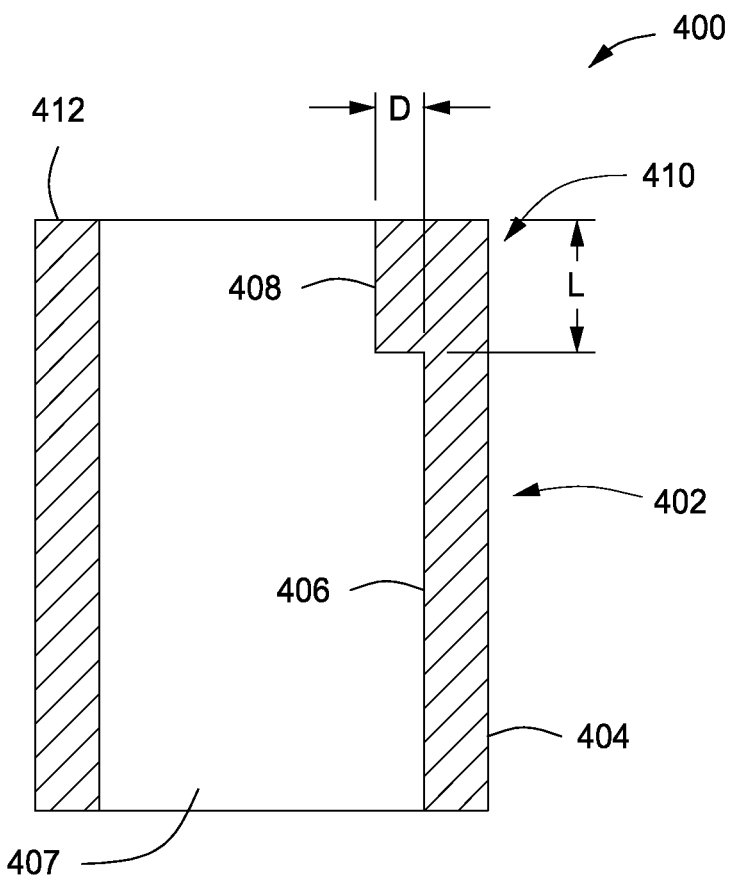
FIG. 4A depicts a cross section view of the collar of FIG. 4, taken along line IV-IV

FIGS. 4 and 4A depict a non-limiting embodiment of a collar 400 suitable for use with embodiments of the bushing described above. Collar 400 comprises a generally hollow body 402 including an outer wall 404, an inner wall 406, an upper surface 412 between the inner and outer walls, and an engaging feature 408, for example one or more inwardly directed projections (one shown) spaced about the inner wall 406, proximate to the upper portion 410 of the collar 400. The engaging feature 408 interfaces with the axial and circumferential slots 212, 214 in the bushing 100. The collar body 402 is illustrated as having a cylindrical outer shape for ease of illustration only. The outer wall 404, or an end portion of the outer wall 404 opposite the upper surface 412, may be comprised of a series of linear segments, for example four or six segments, facilitating engagement with a tool, such as a wrench, nut driver, or the like.

The inner wall 406 forms the boundary of an aperture 407 sized to accept the body 206 of the bushing 100 in both rotational and axial displacement. The feature 408 has a width W sized for slidable axial displacement within slot 212. The feature 408 further has a depth D and a length L sized for rotational displacement within the circumferential slot 214. The width and depth of the feature 408 may further interface with the detent 216 of the circumferential slot 214 to facilitate retaining the collar 400 in a desired orientation with respect to the bushing 100. A resilient member, such as a spring, (described below with respect to FIG. 6), may be used to bias the feature 408 into the detent 216 to further facilitate retaining the collar 400 in a desired orientation with respect to the bushing 100 (e.g., to prevent the collar 400 from rotating).

Figure 5:
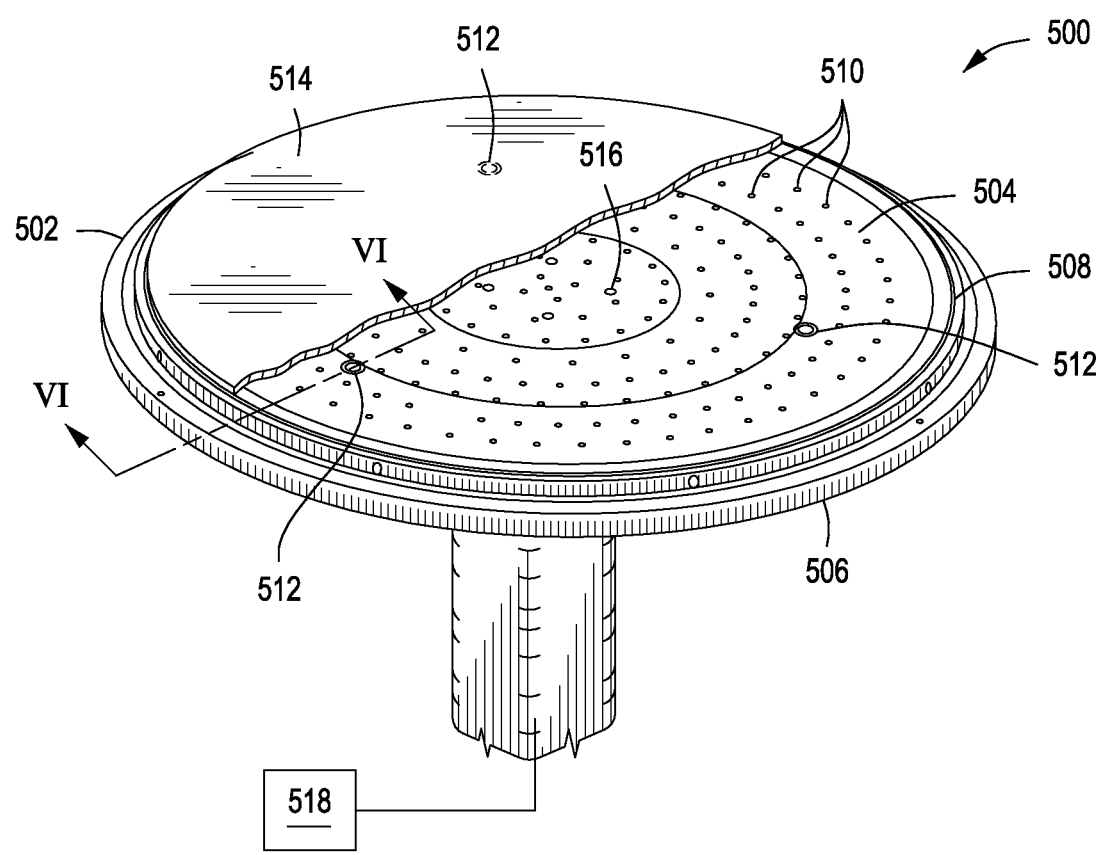
FIG. 5 depicts a perspective view of a substrate support having lift pin assemblies in accordance with at least some embodiments of the present invention.

The non-limiting embodiment of FIG. 5 depicts a substrate support 500 suitable for use with the inventive bushing 100 and collar 400 to provide improved lift pin sealing. The substrate support comprises a plate 502 comprising a top surface 504 and an opposite bottom surface 506. In some embodiments, a raised edge 508 and a plurality of protrusions or bumps 510 may provide support for the perimeter and internal regions, respectively, of the substrate 514 (partially shown). As illustrated, the plate comprises three lift pin holes 512 (one hidden, shown in phantom) although any convenient number of lift pin holes may be provided. In some embodiments, one or more through holes 516 may be provided through the plate 502 to facilitate coupling to a support component 518 that facilitates providing a backside gas to the backside region of the substrate or providing a vacuum to retain the substrate on the substrate support.

Figure 6:
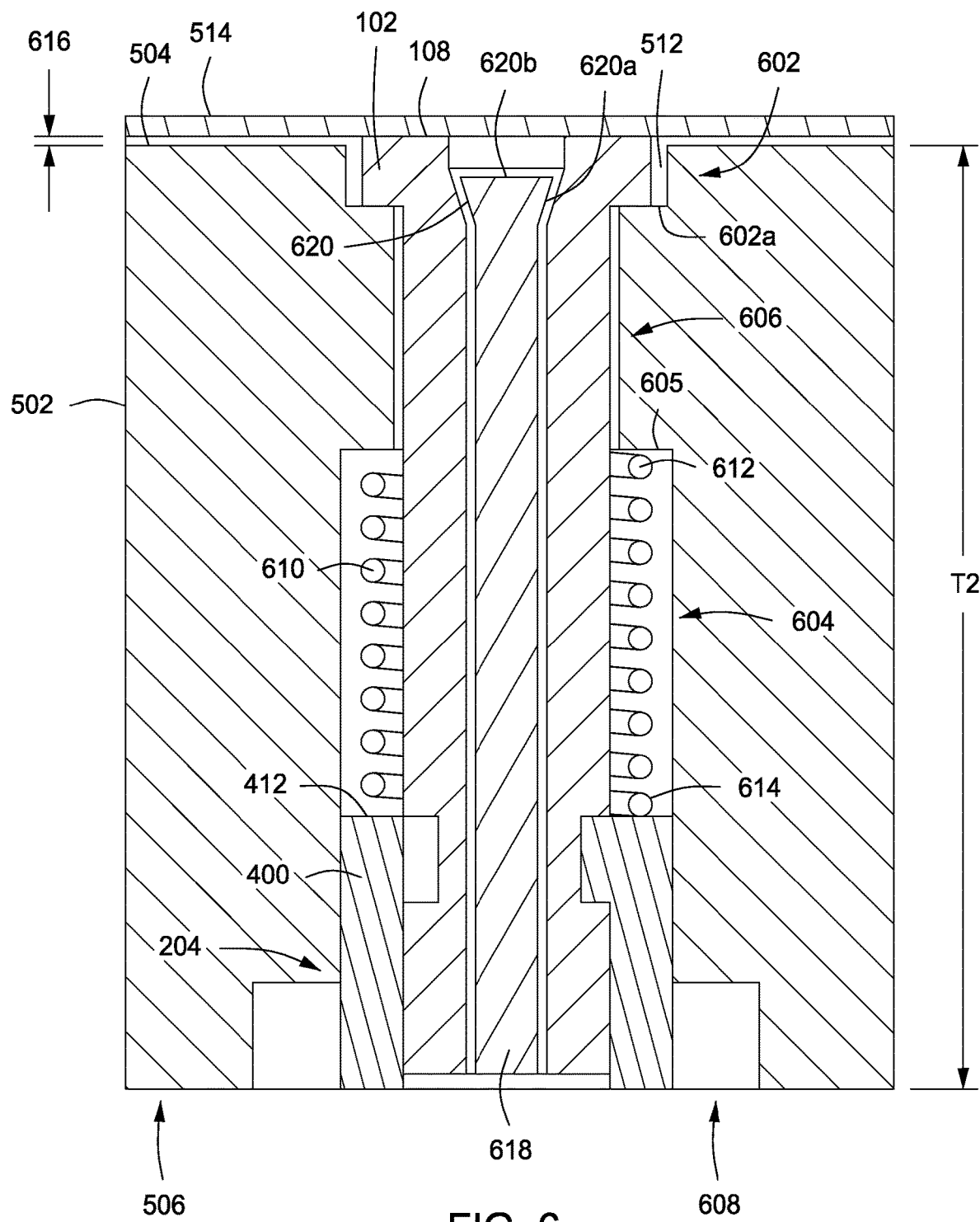
FIG. 6 depicts an enlarged cross sectional view of a portion of the substrate support of FIG. 5 taken along line VI-VI.

FIG. 6 depicts an enlarged cross sectional view of the apparatus of FIG. 5 taken along line VI-VI including a lift pin bushing 100 and collar 400. As shown, the top surface 504 and the bottom surface 506 bound a thickness T2. A lift pin hole 512 is formed through the thickness. As illustrated, the lift pin hole 512 comprises a first portion 602, a second portion 604, and a third portion 606 joining or linking the first and second portions 602, 604.

The first portion 602 is adjacent to the top surface 504 of the plate 502 and extends into the plate 502, terminating at a base 602a (e.g., the first portion may be a counterbore formed in the top surface of the plate). In the non-limiting embodiment illustrated in FIG. 6, the base 602a is generally parallel to the top surface 504. In some embodiments, the base 602a is angled such that the first portion 602 radially increases in diameter (i.e., the first portion may be a countersink formed in the top surface of the plate). The second portion 604 is proximate to the bottom surface 506 and extends into the plate 502, terminating at a shoulder 605 (e.g., the second portion may be a second counterbore formed in the bottom surface of the plate). The third portion 606 extends from the base 602a to the shoulder 605. The third portion 606 is mutually coaxial with the first portion 602 and the second portion 604 and links the first and second portions 602, 604 in fluid communication. As illustrated, the first portion 602 is larger in diameter than the third portion 606, and the second portion 604 is larger in diameter than the third portion 606.

At the bottom surface 506, the lift pin hole 512 may include a fourth portion 608 which is radially larger than the second portion 604 (e.g., the fourth portion may be a third counterbore formed in the bottom surface of the plate about the second counterbore).

Lift pin hole 512 is sized and configured to accept the bushing 100 such that the flange 102 is at least partially recessed into the top surface 504. In some embodiments, the top surface 108 of the bushing is recessed below the top surface 504. In some embodiments, the top surface 108 is flush with the top surface 504. In other embodiments, the top surface 108 extends beyond the top surface 504.

In the embodiment of FIG. 6, first portion 602 is sized to accept the flange 102 with sufficient radial clearance to allow axial displacement of the flange 102 within the first portion 602, for example due to thermal expansion and/or contraction of the flange 102 and the plate 502. The first portion 602 has an axial depth to accept at least a portion of the flange thickness T1 with flange bottom surface 208 in an abutting relationship with the base 602a. In some embodiments, the first portion 602 has an axial depth greater than the thickness T1, such that the top surface 108 of the bushing is below the top surface 504. In other embodiments, the first portion 602 has an axial depth that is less than the thickness T1 such that the top surface 108 is raised above the top surface 504. In embodiments in which the top surface 108 is raised above the top surface 504, the top surface 108 may be raised a sufficient amount to contact the substrate 514 and advantageously prevent contact between the substrate 514 and the plate 502, reducing or eliminating metal contamination at the backside of the substrate 514 when the plate 502 is fabricated from metal.

As illustrated in FIG. 6, third portion 606 is sized to accept the bushing body 206 with clearance sufficient to allow axial displacement of the bushing 100 with respect to the plate 502, for example due to thermal expansion and/or contraction of the flange 102 and the plate 502. Third portion 606 is axially aligned with first portion 602 and diametrically smaller than the first portion 602.

Second portion 604 as illustrated in the non-limiting example of FIG. 6 is axially aligned with first portion 602 and third portion 606 of lift pin hole 512. The second portion 604 is sized to accept the collar 400 in rotational displacement and axial displacement and is larger in diameter than third portion 606 to form a ledge or shoulder 605 adjacent to the third portion 606.

According to the embodiment depicted in FIG. 6, bushing 102 is placed within the lift pin hole 512 with the flange 102 at least partially within first portion 602 and the second end 204 proximal to the bottom surface 506. As illustrated, second end 204 is flush or substantially flush with the bottom surface 506. In other embodiments, the second end may be recessed within the plate 502 or may extend beyond the bottom surface 506.

A resilient element 610, for example a compression spring (such as a helical coil spring), is provided with an internal passage configured to allow axial movement of the member 610 along the body 206 of the bushing 102. The configuration of the outer surface of the resilient element 610 allows axial movement of the resilient element within the third portion 604 of the plate 502. The configuration of the resilient element facilitates axial movement of resilient element 610 within the third portion 604 or along the body 206 regardless of the compressed state or condition of the resilient element 610. In the embodiment illustrated in FIG. 6, the resilient element is substantially coaxially aligned with the body 206 of the bushing 100 within the second portion 604 of the lift pin hole 512.

The non-limiting exemplary collar 400 may be placed in axial alignment with the bushing 100 such that the upper portion 410 is adjacent to second end 204 and rotationally positioned such that feature 408 is aligned with axial slot 212. The collar 400 is positioned such that a portion of the body 206 is received within the aperture 407. The collar 400 maybe advanced along the length of the bushing 100 a distance sufficient to engage the collar upper surface 412 with the second end 614 of an appropriately long resilient element 610 and urge the first end 612 of the resilient element 610 to an abutting relationship with a shoulder 605 of the second portion 604. The collar 400 may be further advanced until feature 408 is aligned with circumferential slot 214, thereby compressing the resilient element 610. Rotational displacement of the collar 400 with respect to the bushing 100 places the feature 408 within the circumferential slot 214, locking the collar 400 to the bushing 100. In some embodiments, a rotational displacement places the feature 408 within the detent 216. The detent 216 cooperates with the feature 408 to releasably lock the collar 400 against rotational displacement. In an alternate embodiment, the collar 400 includes a detent (not shown) configured to cooperate with a protrusion in the circumferential slot 214 to achieve the same, or similar, result.

The collar and bushing configuration described above is illustrative only. The bushing profile 210 and the collar 400 may comprise other elements adapted to cooperate to removably lock the collar 400 to the bushing 100 against axial displacement while placing the resilient element in a compressed condition. Features other than the detent 216 may be provided to removably lock the collar 400 to the bushing 100 against rotational displacement.

The force generated by the compression of the resilient element 610 urges the feature 408 against the sidewall of the circumferential slot 214, and in some embodiments, into the detent 216, such that further rotation of the collar 400 is resisted. Desired rotation of the collar 400 may be facilitated by axially displacing the collar 400 against the resistive force of the resilient element 610 to displace the feature 408 from the sidewall of the circumferential slot 214, and/or the detent 216.

In the configuration described above, the force resulting from the compression of the resilient element 610 urges the collar 400 downward (i.e., toward the second surface 506 of the plate 502) relative to the top surface 108. The engagement of the collar feature 408 in the circumferential slot 214, when the collar 400 and bushing 100 are in a removably locked relationship, blocks axial displacement of the collar 400 with respect to the bushing 100. As such, the resilient element 610 urges the bushing 102 against the base 602a, thereby preventing downward axial displacement of the bushing 100 with respect to the plate 502. Therefore, the force generated by the compression of the resilient element 610 urges the bottom surface 208 into intimate contact with the base 602a, thus substantially forming a seal. In some embodiments, the seal formed between the bottom surface 208 and base 602a is sufficient to prevent, or substantially prevent, backside pressure leakage through the lift pin hole 512.

The inventors have noted that the configuration thus described creates an enhanced seal between the bushing 100 and the plate 502 at the interface between the bottom surface 208 and the base 602a while still facilitating relative movement of the lift pin assembly and the plate due to differences in radial expansion during use. Differences in linear expansion of the bushing 100 and the thickness T2 of the plate 502 due to thermal response may not have an effect on the integrity of the seal due to the force provided by the resilient element which maintains the bottom surface 208 and the base 602a in sealing contact. In addition, bushing 100, collar 400 and resilient element 610 are easily removed from the plate 502 for maintenance, such as cleaning or replacement.

Figure 7A:
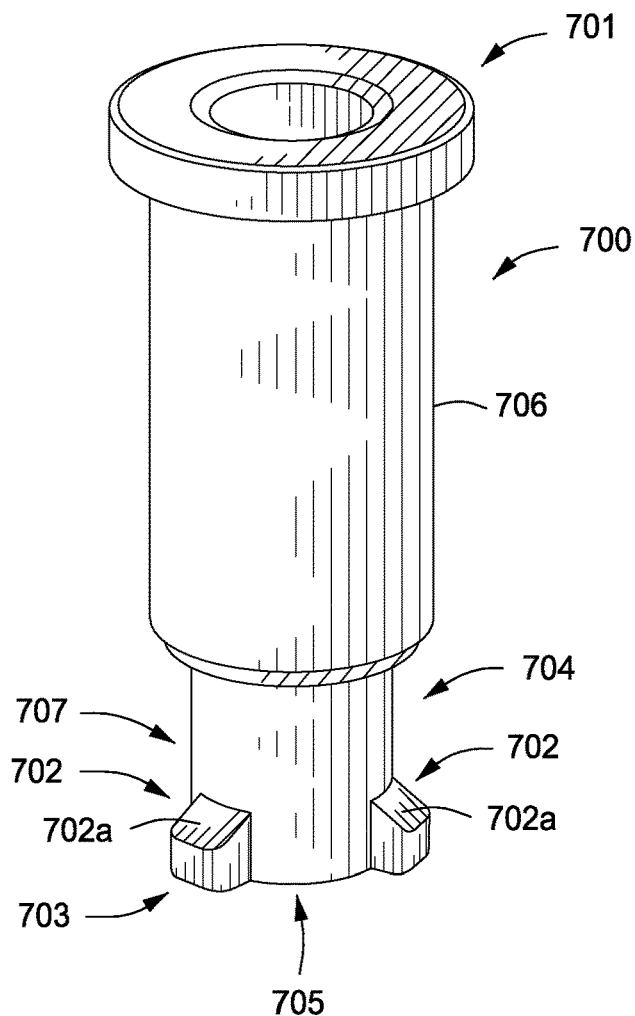
FIGS. 7A-B respectively depict isometric views of a bushing and a collar in accordance with some embodiments of the present invention.

Although described as having a particular configuration above, the bushing 100 and collar 400 may have other configurations to enable selective attachment and removal of the collar 400 from the bushing 100. For example, as depicted in FIG. 7A, a bushing 700 is shown having a body 706 having a first end 701 and a second end 703. The first end 701 may be similar to the first end 202 of the bushing 100. The second end 703 comprises a profile, generally illustrated as 707, configured to releasably or removably lock a collar (shown in FIG. 7B) to the bushing 700. In a non-limiting embodiment illustrated in FIG. 7A, the profile 707 has a reduced diameter (as compared to the remainder of the body 706) portion 704 and one or more projections 702 to engage with a locking collar, as described below. In the embodiment depicted in FIGS. 7A-C, three projections are shown. The reduced diameter portion 704 generally extends from a second end surface 705 toward the first end 701a sufficient distance to provide clearance for the mating features of the collar as described below.

Figure 7B:
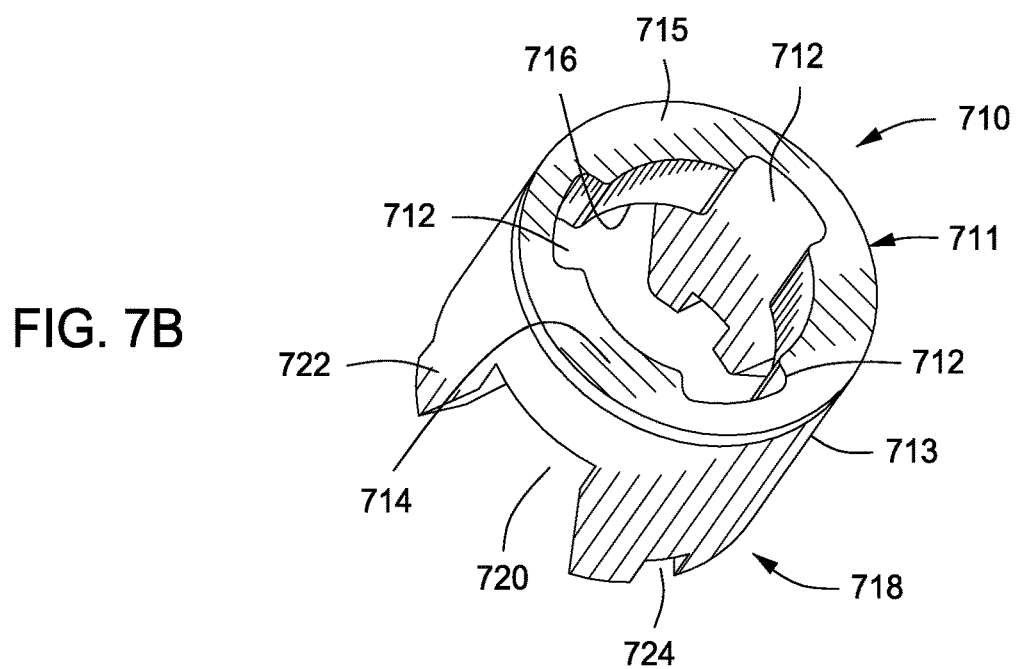

FIG. 7B depicts an exemplary collar 710 for use with the bushing 700 in accordance with some embodiments of the present invention. The collar 710 has a hollow cylindrical body 713 with a partially closed first end 711 (e.g., by an inwardly extending flange 714). One or more slots 712, to correspond with the number of projections 702 of the bushing 700 (three shown), are formed in the flange 714 of the collar 710. The flange 714 also provides a support surface 715 for a resilient member (similar to the surface 412 and resilient element 610 discussed above). The slots 712 are configured to receive the projections 702 and allow the projections 702 to pass through the flange 714. An opposing surface 716 of the flange 714 (e.g., opposing support surface 715) between the slots 712 can include a feature configured to engage a surface 702a of the projections 702 (e.g., the opposing surface may be curved or shaped to mate with the surface 702a).

A portion of the cylindrical body 713 at a second end 718 of the collar 710, opposite the first end 711, may be divided by a plurality of radial notches 720 between axially extending projections 722. In some embodiments, the notches 720 are sized and shaped such that the projections 722 of a similarly formed and oppositely directed collar 710 may fit within the notches 720. A radial notch 724 may be cut through the lower end of one or more of the projections 722.

The collar 710 may be placed in axial alignment with the bushing 700 such that the slots 712 are aligned with the projections 702. The collar may be advanced along the length of the bushing 700 a distance sufficient to place surface 702a below surface 716, while compressing the resilient element 610 between the shoulder 605 and the flange 714. Rotational displacement of the collar 710 with respect to the bushing 700 removes the slots 712 from alignment with the projections 702. Axial displacement of the collar 710 under the force of the compressed resilient element 610 engages surface 702a with surface 716, locking the collar 710 to the bushing 700.

Figure 7C:
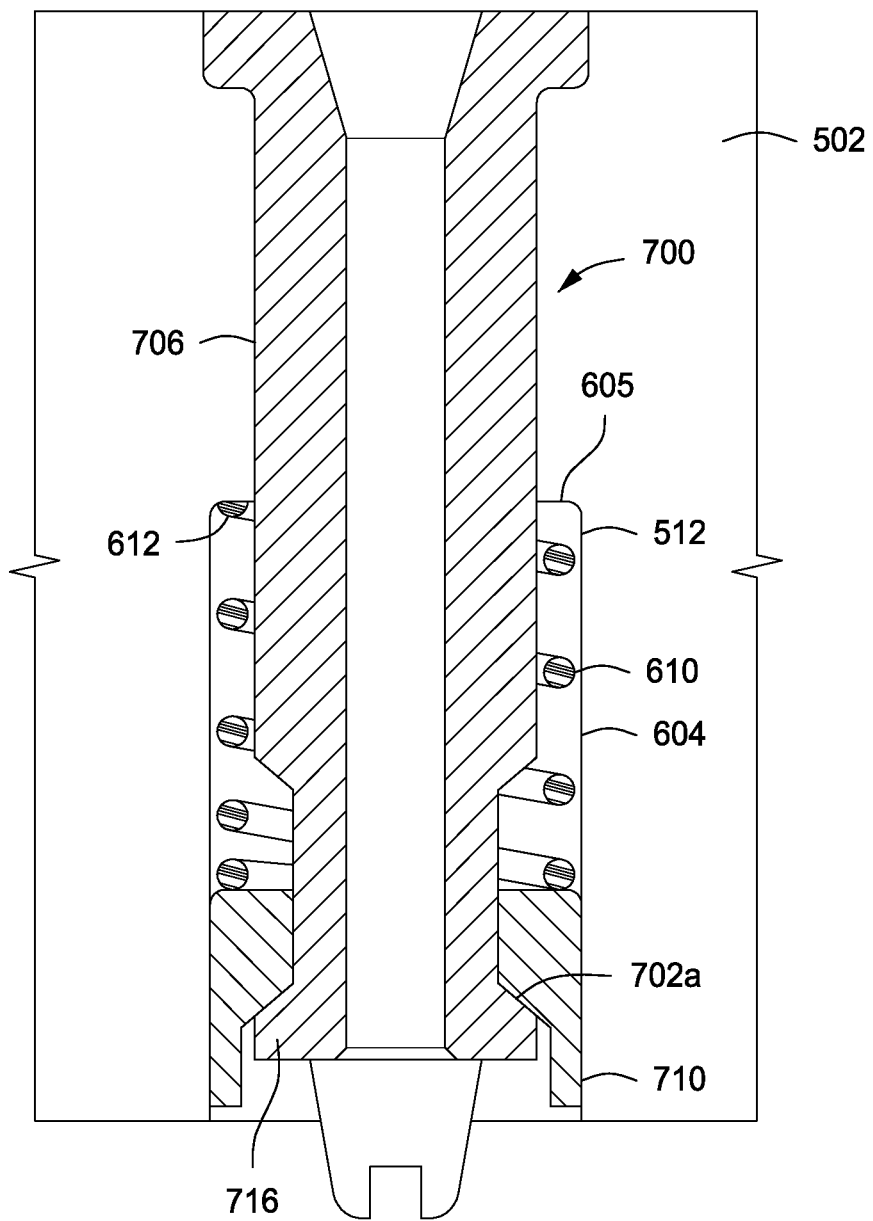
FIG. 7C depicts a cross sectional view of a portion of a substrate support having the bushing and collar of FIGS. 7A-B.

As illustrated in FIG. 7C, the exemplary bushing 700 may be placed in a lift pin hole 512 with resilient element 610 along a portion of the body 706 with the first end 612 abutting the shoulder 605 as discussed above. The exemplary collar 710 may be placed in axial alignment with the bushing 700 such that the slots 712 are aligned with the projections 702. The collar may be advanced along the length of the bushing 700 a distance sufficient to place surface 702a below surface 716, while compressing the resilient element 610 between the shoulder 605 and the top wall 714. Rotational displacement of the collar 710 with respect to the bushing 700 removes the slots 712 from alignment with the projections 702. Axial displacement of the collar 710 under the force of the compressed resilient element 610 engages surface 702a with surface 716, locking the collar 710 to the bushing 700.

Rotational and axial displacement of the collar 710 along the length of the bushing 700 while compressing the resilient element 610 may be facilitated by the use of a tool. For example, in an embodiment in which the notches 720 and projections 722 are similarly sized and shaped, the projections 722 of an oppositely direct collar 710 could be used as a tool. In other embodiments, a bladed tool, for example a screwdriver, or a customized tool, could be used to facilitate axial and rotational displacement of the collar 710.

As illustrated in FIG. 6, in some embodiments, the flange top surface 108 may extend above the top surface 504. The offset between the flange top surface 108 and the top surface 504 may be the same, or substantially the same, as the height of the raised edge 508 and the bumps 510 above the top surface 504. The flange top surface 108, the raised edge 508, and the bumps 510 may cooperate to support the substrate 514 at least during processing.

A backside pressure differential may be formed in the void or gap 616 between the top surface 504 and the substrate 514. The seal between the bottom surface 208 and the base 602a described above facilitates the formation and maintenance of the pressure differential. The contact between the substrate 514 and the flange top surface 108 can also facilitate the pressure formation in the gap by sealing the bore 104. In some embodiments, a substrate lift pin or lift pin 618 may be disposed in the bore 104. As illustrated in the non-limiting embodiment of FIG. 6, the lift pin 618 includes a head 620 configured to seal against a part of the radially expanding portion 106 of the bore 104. For ease of illustration only, the head 620 is shown as having a sealing surface 620a inclined at substantially the same angle as the radially expanding portion 106. In other embodiments, other head configurations can be provided, including non-limiting examples such as a bulbous or round configuration.

When positioned to seal the bore 104, the head 620 of the lift pin 618 may be below the flange top surface 108 such that the head 620 is not in contact with the substrate 514 as illustrated in FIG. 6. The inventors have noted that by eliminating contact between the lifting surface 620b of the head 620 and the substrate 514, heat transfer to or from the substrate is reduced, advantageously improving thermal uniformity of the substrate and therefore, improving uniformity of substrate processing. Additionally the reduced contact area further reduces the likelihood of contaminating the backside of the substrate 514.

Thus, embodiments of lift pin assemblies and substrate supports incorporating such lift pin assemblies are provided which can provide improved lift pin sealing that facilitates at least the formation and maintenance of substrate backside pressure in the void between the substrate and the plate.

While the foregoing is directed to embodiments of the present invention, other and further embodiments of the invention may be devised without departing from the basic scope thereof.

The invention claimed is:

1. A lift pin assembly, comprising:
a body with a first end including a flange having a substantially planar top surface;
a bore through the body to receive a lift pin, wherein a portion of the bore proximate to the first end expands outwardly, and wherein the bore is configured to allow a body of the lift pin to freely axially move through the bore;
a profile on an outer surface of the body proximate a second end of the body; and
a tubular collar axially aligned with the body and having an inner wall defining an aperture sized to accept the body, wherein the profile includes one of a protrusion or a recess and the collar includes the other one of the protrusion or the recess, wherein the protrusion and the recess interface with each other in a manner to removably lock the collar onto the second end, and wherein, when the tubular collar is locked onto the second end of the body, opposing surfaces of the flange and the tubular collar are disposed in a spaced apart relation configured to receive a resilient element disposed around the body between the flange and the tubular collar, and to clamp the lift pin assembly to a support plate disposed in the space between the opposing surfaces of the flange and the tubular collar.

2. The lift pin assembly of claim 1, wherein the flange further comprises a flange bottom surface that is generally parallel to the substantially planar top surface.

3. The lift pin assembly of claim 1, further comprising a lift pin disposed through the bore, the lift pin having a head with a radially expanding surface that mates with the surface of the body defined by the outwardly expanding portion of the bore to form a seal between the lift pin and the body, wherein a body of the lift pin is freely vertically movably through the bore.

4. The lift pin assembly of claim 1, wherein the body is formed from one or more of aluminum nitride, aluminum oxide, ceramic, coated or uncoated stainless steel, aluminum, nickel, or nickel-based alloys.

5. The lift pin assembly of claim 1, wherein the profile comprises an axial slot intersecting a circumferential slot.

6. The lift pin assembly of claim 5, further comprising a detent disposed in the circumferential slot.

7. The lift pin assembly of claim 5, wherein the circumferential slot encircles the second end.

8. The lift pin assembly of claim 1, wherein the bore is not threaded.

9. The lift pin assembly of claim 1, wherein the tubular collar is removably locked onto the second end by axial movement of the tubular collar along the body from the second end toward the first end and subsequent rotational movement of the tubular collar with respect to the body in a first direction, and wherein the collar is removed from the second end by rotational movement of the tubular collar with respect to the body in a second direction opposite the first direction and subsequent axial movement of the tubular collar along the body toward the second end.

10. The lift pin assembly of claim 1, further comprising:
a resilient element disposed around the body and between the flange and a surface of the tubular collar facing the flange that, when compressed, provides a biasing force against the tubular collar in an axial direction away from first end of the body.

11. A substrate support, comprising:
a plate having a top surface and an opposing bottom surface;
a hole formed through the plate, wherein the hole includes a first counterbore or countersink disposed in the top surface of the plate about the hole, and wherein the hole further includes a second counterbore disposed in the bottom surface of the plate about the hole, wherein an enlarged diameter of the second counterbore is formed in the bottom surface;
a body with a first end including a flange configured to interface with the first counterbore or countersink, an opposing second end, and a bore through the body, wherein the body is disposed within the hole such that the flange is disposed at least partially in the first counterbore or countersink;
a collar removably coupled to the second end of the body; and
a resilient element disposed within the hole and compressed between the plate and the collar, wherein the resilient element biases the body against the plate.

12. The substrate support of claim 11, wherein the bore comprises a radially expanding portion proximate to the first end of the body.

13. The substrate support of claim 12, further comprising a lift pin disposed through the bore, the lift pin having a head with a surface that mates with the radially expanding portion to form a seal between the lift pin and the body.

14. The substrate support of claim 13, wherein the lift pin comprises one or more of aluminum nitride, aluminum oxide, ceramic, coated or uncoated stainless steel, aluminum, nickel, or nickel-based alloys.

15. The substrate support of claim 11, wherein the flange has a thickness that is greater than a depth of the first counterbore or countersink.

16. The substrate support of claim 11, wherein the body comprises a ceramic material.

17. The substrate support of claim 16, wherein the ceramic material is aluminum nitride or aluminum oxide.

18. The substrate support of claim 11, further comprising a third counterbore disposed in the bottom surface about the second counterbore.

19. A substrate support, comprising:

a plate having a top surface and an opposing bottom surface;

a lift pin hole formed through the plate, the lift pin hole comprising a first portion at the top surface, the first portion comprising a base, a second portion proximate to the bottom surface comprising a shoulder; and a third portion, linking the first and second portions, wherein the first portion is radially larger than the third portion, and the second portion is radially larger than the third portion;

a lift pin bushing disposed through the lift pin hole and comprising a body with a first end including a flange, a bore through the body, and a profile on an outer surface proximate a second end of the lift pin bushing;

a collar axially aligned with the body and comprising an outer wall sized for axial displacement within the second portion, an inner wall forming the boundary of an aperture sized to accept the body of the lift pin bushing and configured to engage the profile at a point along a length of the body to block axial displacement of the collar along the body; and an upper surface between the outer wall and the inner wall, wherein the profile includes one of a protrusion or a recess and the collar includes the other one of the protrusion or the recess to removably lock the collar onto the bottom surface; and a resilient element having an outside dimension sized for axial displacement within the second portion, and an inner dimension greater than the third portion;

wherein the lift pin bushing is arranged within the lift pin hole such that the flange is at least partially within the first portion and the second end extends at least partially through the second portion, wherein the resilient element is arranged coaxially with the second portion and at least partially within the second portion, and wherein the collar is advanced along the body such that the body is received within the aperture and the upper surface at least partially compresses the resilient element against the shoulder and the inner wall engages the profile and blocks axial movement along the body.

* * * * *